United States Patent [19]
Andrews et al.

[11] Patent Number: 6,064,225
[45] Date of Patent: May 16, 2000

[54] GLOBAL SIGNAL DISTRIBUTION WITH REDUCED ROUTING TRACKS IN AN FPGA

[75] Inventors: William B. Andrews, Long Pond; Barry K. Britton, Orefield, both of Pa.; Kai-Kit Ngai, Campbell, Calif.; Gary P. Powell, Allentown, Pa.; Satwant Singh, Fremont, Calif.; Carolyn W. Spivak, Emmaus, Pa.; Richard G. Stuby, Jr., New Tripoli, Pa.

[73] Assignee: Lucent Technologies Inc., Murray Hill, N.J.

[21] Appl. No.: 09/045,128

[22] Filed: Mar. 20, 1998

[51] Int. Cl.[7] .......................... H01L 25/00; H03K 19/177
[52] U.S. Cl. .................. 326/41; 326/38; 326/39; 326/47
[58] Field of Search .................. 326/41, 47, 38, 326/39

[56] References Cited

U.S. PATENT DOCUMENTS

| | | | |
|---|---|---|---|
| 5,212,652 | 5/1993 | Agrawal et al. | 364/489 |
| 5,384,497 | 1/1995 | Britton et al. | |
| 5,490,074 | 2/1996 | Agrawal et al. | 364/489 |
| 5,652,529 | 7/1997 | Gould et al. | 326/93 |
| 5,914,616 | 6/1999 | Young et al. | 326/41 |

*Primary Examiner*—Michael Tokar
*Assistant Examiner*—Daniel D. Chang

[57] ABSTRACT

The FPGA has an array of programmable logic cells (PLCs) surrounded by a ring of programmable input/output cells (PICs). In one embodiment, the pads of each pair of adjacent PICs, as well as internal routing resources of each of the two PICs, are programmably connected to a single global-signal spine, and the spine is programmably connected directly to only half of the perpendicular branches. Each of the branches can then connect to the cells in two adjacent rows/columns of the array to provide a global signal to any of the cells in the array while only using a branch per every two rows/columns of the device. The reduced number of spine-to-branch connections reduces the capacitive loading on the spines, thereby increasing the speed at which global signals can be transmitted. In addition, sharing spines between adjacent PICs reduces the number of spines in the FPGA by half, thereby providing additional layout space for other resources. Sharing branches also has the same effect as sharing spines in that the number of branches is reduced by half, also increasing global signal speed. These advantages are achieved without reducing the programming flexibility of the FPGA.

23 Claims, 4 Drawing Sheets

GLOBAL SIGNAL DISTRIBUTION WITH REDUCED ROUTING TRACKS IN AN FPGA

BACKGROUND OF THE INVENTION

1. Field of the Invention

The present invention relates to integrated circuits, and, in particular, to field programmable gate arrays.

2. Description of the Related Art

FIG. 1 shows a block diagram of a conventional field programmable gate array (FPGA) 100, consisting of an array of programmable logic cells (PLCs) 102 surrounded by a ring of programmable input/output (I/O) cells (PICs) 104. The PICs handle the flow of data into and out of the PLC array, which may be programmed by a user to implement a desired set of operations.

FIG. 2 shows a more detailed schematic diagram of part of conventional FPGA 100 of FIG. 1. FIG. 2 shows four PICs that correspond to two adjacent columns in the PLC array. PIC 202 and PIC 204 are the top and bottom PICs, respectively, for column i in the PLC array, while PIC 206 and PIC 208 are the top and bottom PICs, respectively, for column i+1 in the PLC array. Each PIC has four pads (e.g., 210) connected to the inputs of a four-to-one mux (e.g., 212). For each PIC, the output of the mux is connected to a global-signal spine (e.g., 214) that carries global signals from the PIC to perpendicular branches (e.g., 216) that correspond to rows in the PLC array and provide programmable connections to the individual PLCs (not shown in FIG. 2). Analogously, but not represented in FIG. 2, FPGA 100 also has left and right PICs that drive horizontal spines that are programmably connected to vertical branches in the same manner as shown in FIG. 2 for the vertical spines and horizontal branches of FPGA 100. The horizontal and vertical spines and corresponding vertical and horizontal branches provide the flexibility in FPGA 100 to access any PLC from any pad of any PIC.

According to conventional FPGA design, each spine 214 is unidirectional. For example, spine 214 can only be driven downward from PIC 202, while spine 218 which can only be driven upward from PIC 204. In order to provide access to each branch from each PIC, each vertical spine may be programmably connected directly to each horizontal branch, and each horizontal spine may be programmably connected directly to each vertical branch. Each programmable connection adds capacitance to the spine, which slows down the speed at which the PIC can transmit global signals to the PLCs. Moreover, in conventional FPGA designs, only one of the two spines that correspond to a given column of PLCs can drive onto a given branch at a time. Thus, when PIC 202 drives the downward spine 214 for column i in FPGA 100 and spine 214 then drives branch 216, PIC 204 can drive the upward spine 218, but spine 218 cannot drive onto branch 216.

SUMMARY OF THE INVENTION

In one embodiment, the present invention is an integrated circuit having a field programmable gate array. The FPGA has (a) an array of PLCs, each of which comprises a programmable function unit (PFU); (b) a ring of PICs surrounding the array of PLCs; (c) one or more spines running in a first direction on the FPGA; and (d) one or more branches running in a second direction, orthogonal to the first direction, on the FPGA. The one or more spines are configured to programmably directly drive the one or more branches, and the one or more branches are configured to programmably directly connect to the PFUs, where each branch is shared by two or more PFUs in at least two rows/columns of the array.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

The present invention generally relates to the way an FPGA distributes a signal, for example, a clock signal from the user PIC to the cells in an FPGA array in a fast manner with low skew and little overhead in area and global routing. In each PIC, a signal from a pad is programmably connected to a spine, which has programmable connections typically to every other perpendicular branch. Each cell in the FPGA array has programmable connections to the different branches crossing the cell. By using half the number of programmable spine-to-branch connections (e.g., one in every other row/column) and using programmable connections between neighbors (e.g., adjacent rows/columns of cells), the total skew may be reduced between the nearest and farthest cell receiving the global signal. Reducing the number of programmable connections on each spine may reduce the capacitive load on the spine and make the distribution of the global signal faster. Since, in some embodiments, only every other row/column contains a driven clock branch, the amount of routing resources used and the power consumption are both reduced.

FPGAs according to certain embodiments of the present invention have a number of unique characteristics. The FPGAs have programmable connectivity from all pads of two neighboring adjacent programmable I/O cells to a single spine. The FPGAs have programmable connections from the routing resources of two neighboring, adjacent PICs to a single spine, thus allowing signals generated internally to be routed using the present invention. The FPGAs have spines that have programmable connections from both the pads and local routing resources of two neighboring, adjacent PICs. The FPGAs have dedicated, fast, programmable connections between neighboring cells to support sharing of global signals locally, in order to reduce the capacitive load on a spine. The FPGAs have a single directional global signal spine in each row/column, with an architecture to support full global signal distribution from all programmable I/O cell pads.

Figure 1:
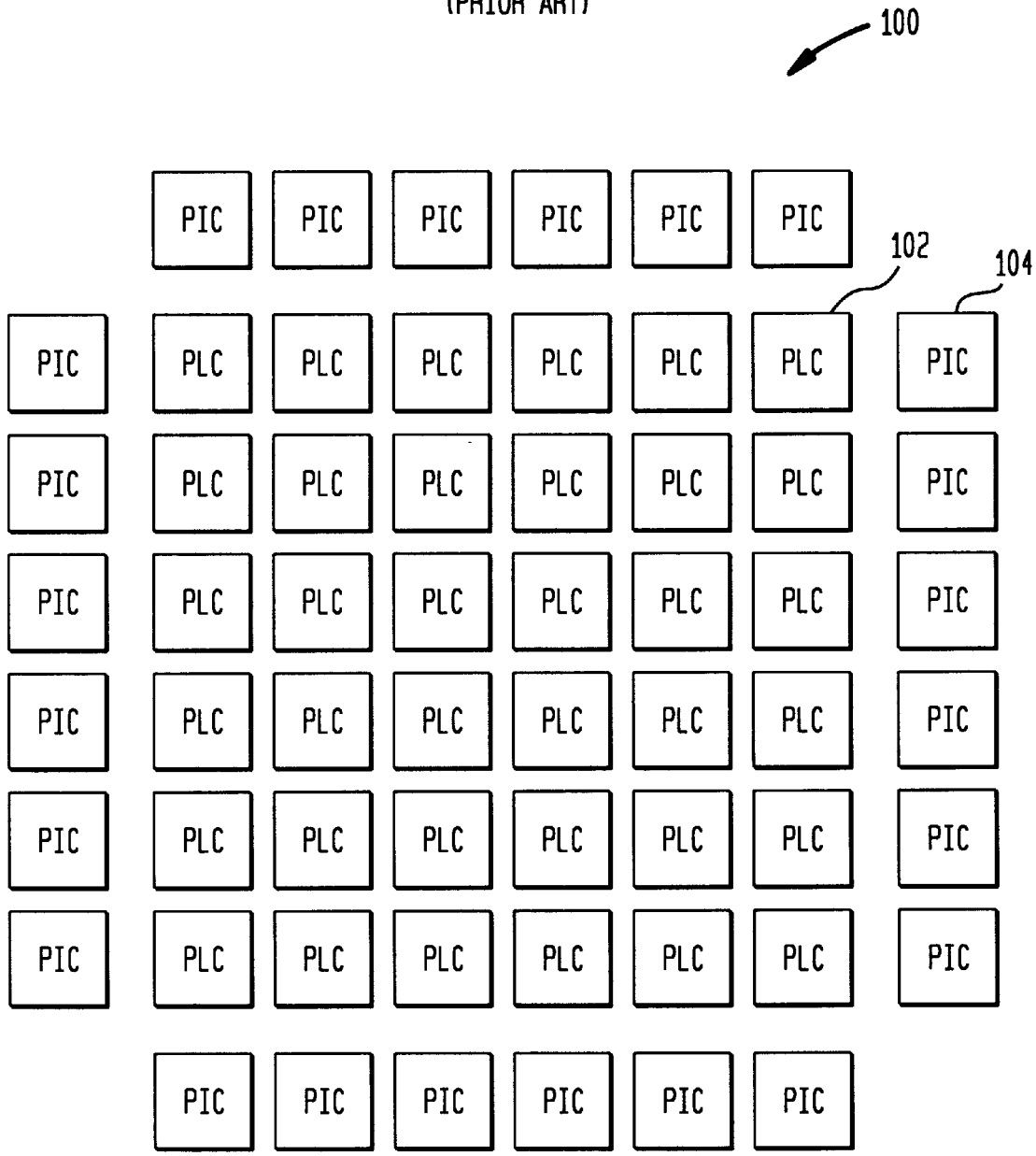
FIG. 1 shows a block diagram of a conventional field programmable gate array (FPGA)
Figure 2:
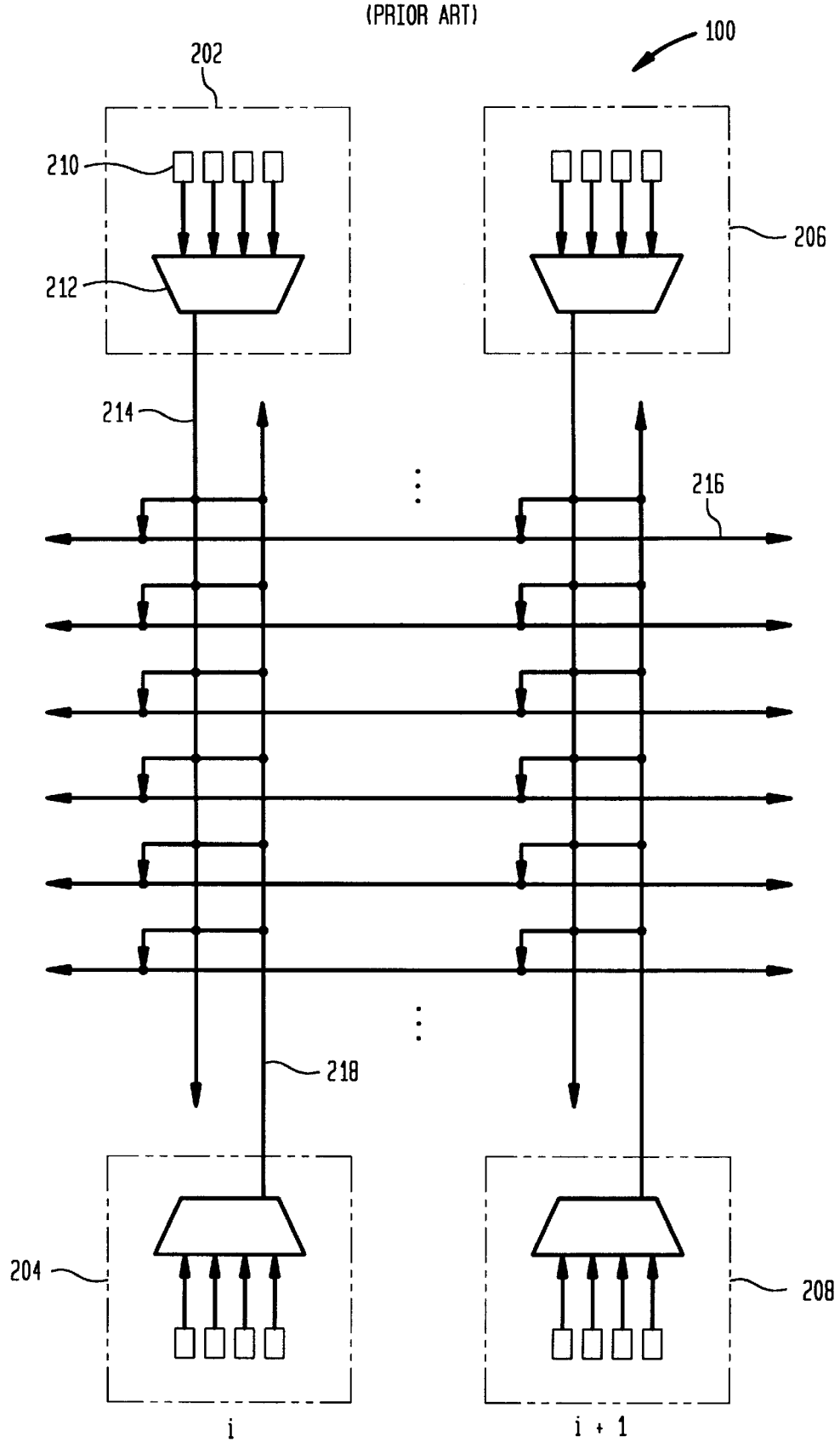
FIG. 2 shows a more detailed schematic diagram of part of the conventional FPGA of FIG. 1.
Figure 3:
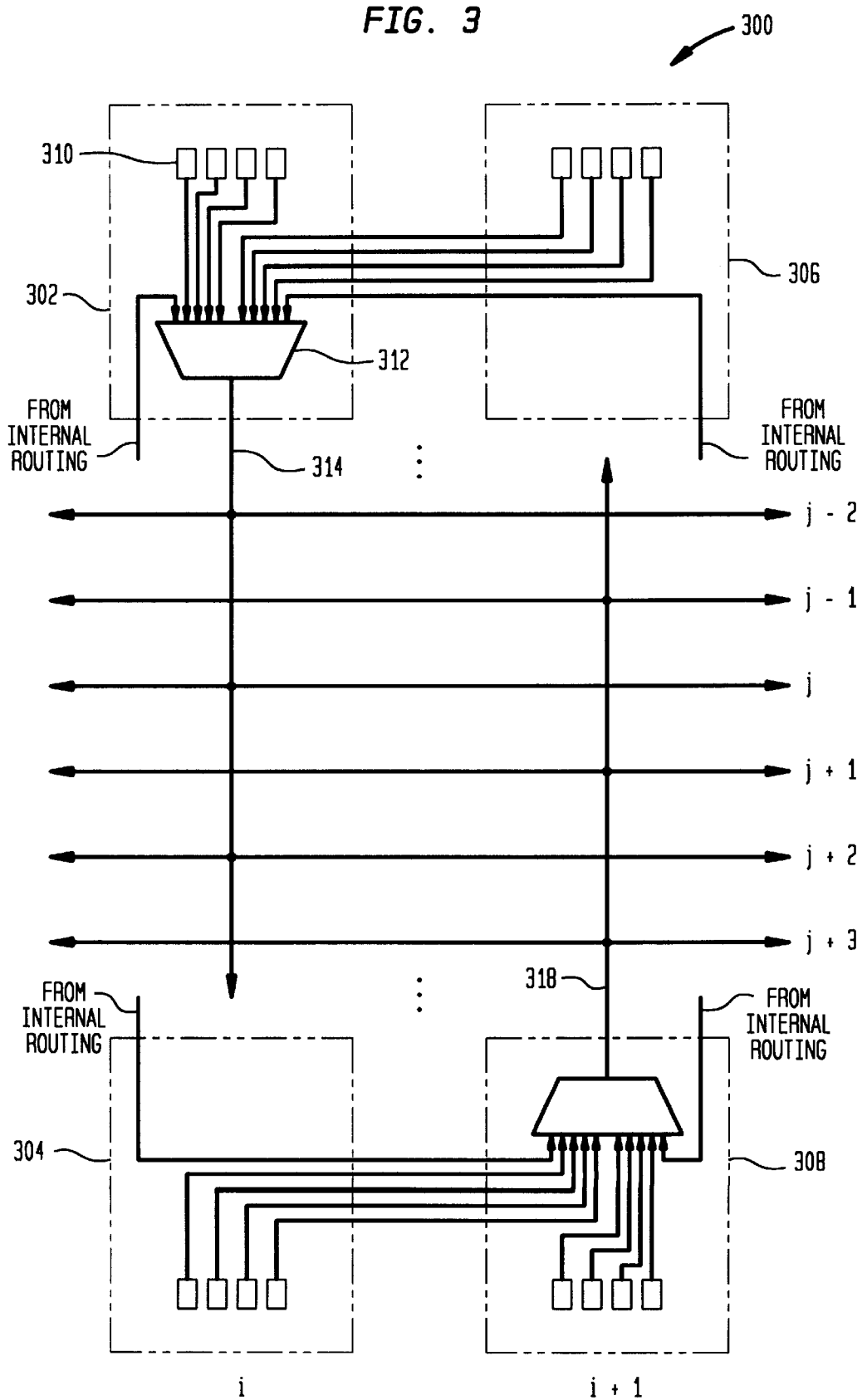
FIG. 3 shows a schematic diagram of part of an FPGA, according to one embodiment of the present invention.

FIG. 3 shows a schematic diagram of part of an FPGA 300, according to one embodiment of the present invention. FPGA 300 has the same overall block-level architecture as FPGA 100 of FIG. 1. However, as shown in FIG. 3, the details of FPGA 300 differ from those of FPGA 100 shown in FIG. 2. In particular, in FPGA 300, each pair of adjacent PICs are programmably connected to drive a single spine. For example, PIC 302 and PIC 306 are programmably connected to drive downward spine 314, which corresponds to column i in FPGA 300, while PIC 304 and PIC 308 are programmably connected to drive upward spine 318, which corresponds to column i+1 in FPGA 300. In particular, the pads (e.g., 310) of PIC 302 and the pads of PIC 306 are all connected to a single mux 312 located in PIC 302. In addition, signals from internal routing resources of each of PIC 302 and PIC 306 are also input to mux 312. The output of the ten-to-one mux 312 is connected to drive spine 314.

Another difference between FPGA 300 according to the present invention and conventional FPGA 100 of FIG. 2 is that, in FPGA 300, each spine is programmably connected directly to only half of the perpendicular branches, with adjacent spines connected to different branches. For example, as shown in FIG. 3, spine 314 is programmably connected directly to branches j−2, j, and j+2, while spine 318 is programmably connected directly to branches j−1,j+1, andj+3. Although FIG. 3 shows the spines programmably connected to every other branch, in general, the spines are programmably connected to a subset of the branches. Branches run the full width/height of the array from a PIC on one edge to the corresponding PIC on the opposite edge of the FPGA.

Figure 4:
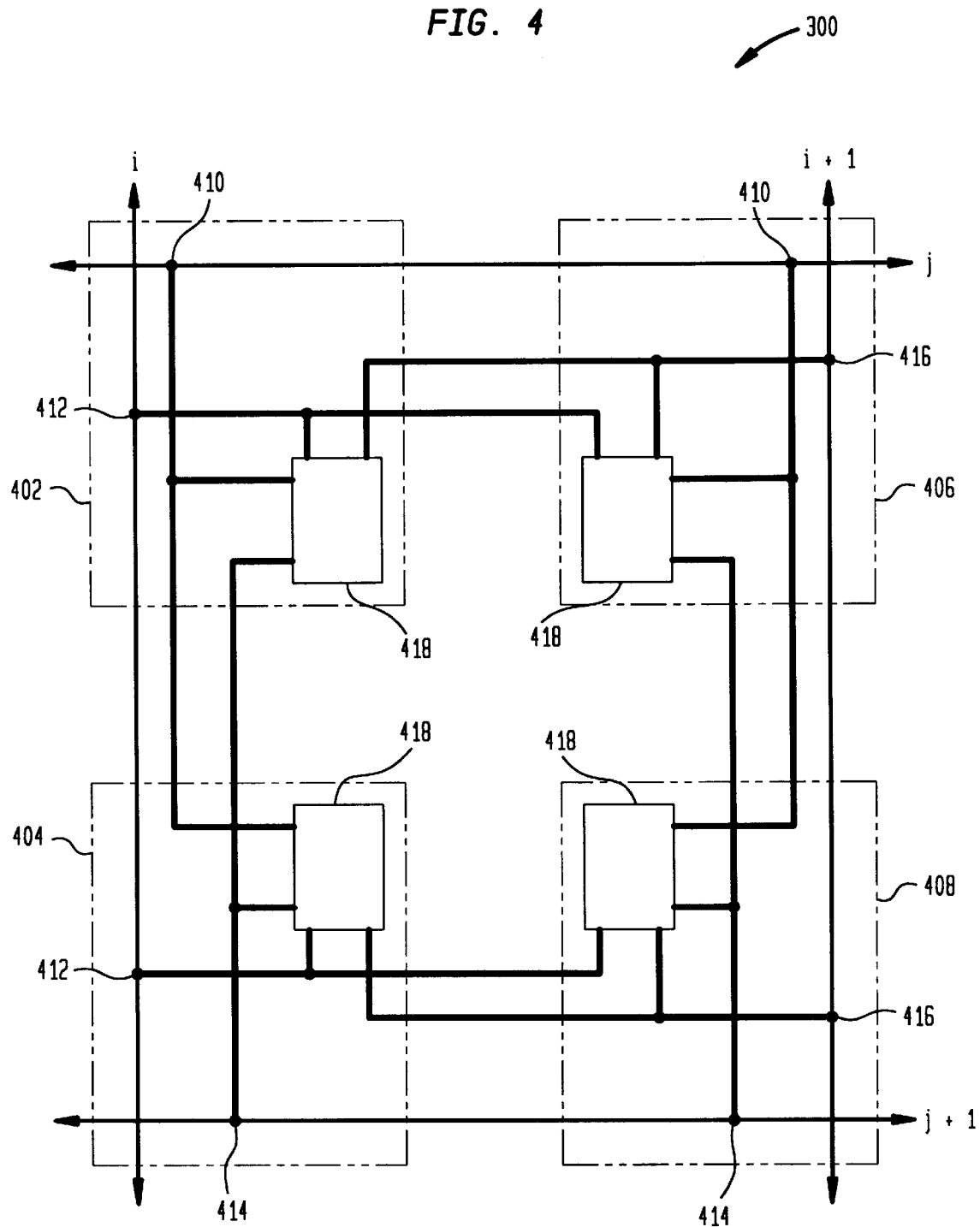
FIG. 4 shows a schematic diagram of the branch-to-cell and cell-to-cell connections for both the horizontal and vertical branches in the FPGA of FIG. 3.

FIG. 4 shows a schematic diagram of the branch-to-cell connections for both the horizontal and vertical branches in FPGA 300 of FIG. 3. Each cell has a programmable connection to each of its corresponding horizontal and vertical branches. For example, cell 402 has programmable connection 410 to horizontal branch j and programmable connection 412 to vertical branch i. Similarly, cell 404 has programmable connections 414 and 412 to branches j+1 and i, respectively; cell 406 has programmable connections 410 and 416 to branches j and i+1, respectively; and cell 408 has programmable connections 414 and 416 to branches j+1 and i+1, respectively.

In addition, each cell has a four-to-one mux 418 that is programmably connected to receive inputs from one or more of horizontal branches j and j+1 and vertical branches i and i+1. That is, mux 418 is adapted to receive two global signals from within the cell and two global signals from neighboring cells. For example, FPGA 300 can be programmed such that mux 418 of cell 402 receives two global signals from nodes 410 and 412 within cell 402, a global signal from node 416 of cell 406, and a global signal from node 414 of cell 404. The output of mux 418 is connected to internal programmable logic (not shown) within the cell (e.g., a programmable function unit (PFU)). Other embodiments of this invention expand the number of multiplexor inputs for mux 418 to also allow one or more local signals to be programmably selected and distributed to the PFU.

Each cell passes the two global signals from its two local branches to neighboring cells. The programmable connection from the local vertical branch is passed to a neighbor horizontally, and the programmable connection from the local horizontal branch is passed to a neighbor vertically. For example, cell 402 passes the global signal received at node 410 from branch j to cell 404 as well as the global signal received at node 412 from the branch i to cell 406. As such, even though only one of the two horizontal branches in each (2×2) sub-array are programmably connected directly to a given vertical spine and only one of the two vertical branches are programmably connected directly to a horizontal spine, the connection scheme of the present invention enables any of the pads from any PIC in the array to access any of the four cells in any such 2×2 sub-array.

Thus, according to certain embodiments of the present invention, in FPGAs such as FPGA 300 of FIGS. 3–4, each global-signal spine can be driven from any of the pads in either of two different PICs or from the local routing resources of either PIC. From each spine, there is a programmable connection to a subset of branches (e.g., every other row/column). Providing programmable connections every other row/column reduces the capacitive load on each spine by half, thereby making the global-signal distribution faster.

The global signal sharing between neighboring cells also reduces routing congestion. For example, each branch can drive all four cells in a (2×2) sub-array. By allowing pairs of PICs to drive individual spines, the number of spines in an FPGA is halved, yet the FPGA still allows each PIC the programmability of driving a global signal. By halving the number of spines, the routing area is reduced for spines, leaving more area on the FPGA for other resources. Also since every cell can be accessed by driving only signal branches in every other row/column, the number of signal branches required is also halved. The sharing of global signals between neighbors reduces routing congestion for the FPGA. As such, the present invention provides fast, low-skew global-signal distribution with low routing overhead. For example, the present invention can be used to transmit system clocks. Any one of the eight pads in a pair of adjacent PICs can drive a clock spine in a row or column. Clock delay and skew are minimized by having a single clock buffer per pair of PICs and by using only clock branches in every other row/column, which also reduces the number of branch drivers required. The clock spine for each pair can also be driven by one of the four PIC switching segments (pSW) (i.e., via internal routing resources) in each PIC of the pair. This allows a signal generated in the PLC array to be routed onto the global clock spine network. The system clock output of the programmable clock manager (PCM), containing a Phase-Locked-Loop or other periodic signal manipulation element, may also be routed to the global system clock spines via the pSW segments.

It should be noted that, in the example shown, only one clock spine and one clock branch are shown per row/column. As more rows and columns are added to the array, each of which contains a spine, more branches are added per row and column to allow multiple clock signals to be driven to every PFU using the present invention. In this case, every clock signal will have its own spine which will drive a branch in every other row/column, where the same branches are never used for different clock signals.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. An integrated circuit having a field programmable gate array (FPGA) comprising:

(a) an array of programmable logic cells (PLCs), each of which comprises a programmable function unit (PFU);

(b) a ring of programmable input/output cells (PICs) surrounding the array of PLCs;

(c) one or more wires used as spines running in a first direction on the FPGA; and (d) two or more wires used as branches running in a second direction, orthogonal to the first direction, on the FPGA, wherein:

each spine runs across all PLCs in its row/column;

each branch runs across all PLCs in its row/column;

each spine is configured to programmably directly drive two or more branches, wherein no two branches that are directly driven by any one spine are in adjacent rows/columns; and each branch is configured to programmably directly drive two or more PFUs in at least two rows/columns parallel to the branches.

2. The invention of claim 1, wherein each PIC comprises a PFU and each branch is further configured to programmably directly drive the PFUs of the PICs in at least two rows/columns parallel to the branches.

3. The invention in claim 1, wherein the spines are configured to be programmably directly driven by input/output (I/O) pins from the PICs.

4. The invention in claim 1, wherein every PLC row/column of the FPGA comprises at least one spine that is configured to be programmably directly driven from I/O pins from the PICs.

5. The invention in claim 3, wherein each spine is configured to be driven from the I/O pins from two adjacent PICs.

6. The invention in claim 3, wherein there is only one spine per row/column of the FPGA and each spine is configured to be driven from either one of two opposite edges of the FPGA.

7. The invention of claim 1, wherein each row/column of the FPGA comprises one or more branches.

8. The invention of claim 1, wherein the spines are configured to be programmably driven by internal signals generated in the FPGA.

9. The invention of claim 8, wherein the internal signals can only be driven onto a spine in the PIC where the spine is driven from.

10. The invention in claim 9, wherein the spines are configured to be programmably directly driven by I/O pins from the PICs.

11. The invention of claim 1, wherein each spine is configured to be directly programmably connected only to branches in every other row/column, while still allowing every PFU to receive a global signal.

12. The invention in claim 1, wherein the spines and branches are used to distribute clock signals to the PFUs.

13. The invention of claim 12, wherein the PFUs comprise registers that are clocked by the clock signals distributed by the spines and branches.

14. The invention of claim 1, wherein a given branch can programmably connect to the PFUs in exactly two rows/columns.

15. The invention of claim 14, wherein each PFU is configured to be programmably connected to (1) its local horizontal branch and (2) the local horizontal branch of a vertically adjacent PLC.

16. The invention of claim 14, wherein each PFU is configured to be programmably connected to (1) its local vertical branch and (2) the local vertical branch of a horizontally adjacent PLC.

17. The invention of claim 14, wherein each PFU is configured to be programmably connected to (1) its local horizontal branch, (2) the local horizontal branch of a vertically adjacent PLC, (3) its local vertical branch, and (4) the local vertical branch of a horizontally adjacent PLC.

18. The invention of claim 1, wherein the branches have other programmable connections to allow them to be used for other general routing when not driven directly by the spines.

19. The invention of claim 1, wherein the spines are uni-directional.

20. An integrated circuit having a field programmable gate array (FPGA) comprising:
   (a) an array of programmable logic cells (PLCs), each of which comprises a programmable function unit (PFU);
   (b) a ring of programmable input/output cells (PICs) surrounding the array of PLCs;
   (c) one or more spines running in a first direction on the FPGA; and
   (d) one or more branches running in a second direction, orthogonal to the first direction, on the FPGA, wherein:
      the one or more spines are configured to programmably directly drive the one or more branches;
      the one or more branches are configured to programmably directly connect to the PFUs;
      each branch is shared by two or more PFUs in at least two rows/columns of the array; and
      there is only one spine per row/column of the FPGA and each spine is configured to be driven from either one of two opposite edges of the FPGA.

21. The invention in claim 20, wherein the spines and branches are used to distribute clock signals to the PFUs.

22. An integrated circuit having a field programmable gate array (FPGA) comprising:
   (a) an array of programmable logic cells (PLCs), each of which comprises a programmable function unit (PFU);
   (b) a ring of programmable input/output cells (PICs) surrounding the array of PLCs;
   (c) one or more spines running in a first direction on the FPGA; and
   (d) one or more branches running in a second direction, orthogonal to the first direction, on the FPGA, wherein:
      the one or more spines are configured to programmably directly drive the one or more branches;
      the one or more branches are configured to programmably directly connect to the PFUs;
      each branch is shared by two or more PFUs in at least two rows/columns of the array; and
      each spine is configured to be directly programmably connected only to branches in every other row/column, while still allowing every PFU to receive a global signal.

23. The invention in claim 22, wherein the spines and branches are used to distribute clock signals to the PFUs.

* * * * *